(12) United States Patent  (10) Patent No.: US 10,175,005 B2
Osenbach et al.  (45) Date of Patent: Jan. 8, 2019

(54) LOW-COST NANO-HEAT PIPE

(71) Applicant: Infinera Corporation, Sunnyvale, CA (US)

(72) Inventors: John W. Osenbach, Kutztown, PA (US); Jie Tang, Fogelsville, PA (US); S. Eugene Messenger, Kutztown, PA (US); John Coronati, Allentown, PA (US)

(73) Assignee: Infinera Corporation, Sunnyvale, CA (US)

( * ) Notice: Subject to any disclaimer, the term of this patent is extended or adjusted under 35 U.S.C. 154(b) by 237 days.

(21) Appl. No.: 14/673,584

(22) Filed: Mar. 30, 2015

(65) Prior Publication Data

US 2016/0290734 A1  Oct. 6, 2016

(51) Int. Cl.
| | | |
|---|---|---|
| *F28D 15/00* | (2006.01) | |
| *F28D 15/02* | (2006.01) | |
| *B23P 15/26* | (2006.01) | |
| *F28D 15/04* | (2006.01) | |
| *H01L 23/427* | (2006.01) | |
| *H01L 21/48* | (2006.01) | |

(52) U.S. Cl.
CPC .............. *F28D 15/02* (2013.01); *B23P 15/26* (2013.01); *F28D 15/0233* (2013.01); *F28D 15/0283* (2013.01); *F28D 15/046* (2013.01); *H01L 21/4882* (2013.01); *H01L 23/427* (2013.01); *B23P 2700/09* (2013.01)

(58) Field of Classification Search
CPC .... F28D 15/02; F28D 15/0233; F28D 15/046; F28D 15/0283; H01L 21/4882; H01L 23/427; H05K 7/20336; B23P 15/26; B23P 2700/09

USPC .............. 165/80.4, 104.19, 104.21, 104.33
See application file for complete search history.

(56) References Cited

U.S. PATENT DOCUMENTS

| | | | | |
|---|---|---|---|---|
| 4,730,666 | A * | 3/1988 | Flint | H01L 23/4338 165/46 |
| 5,388,635 | A * | 2/1995 | Gruber | F28F 3/12 165/185 |
| 5,642,775 | A * | 7/1997 | Akachi | F28D 15/0233 165/104.14 |
| 6,085,830 | A * | 7/2000 | Mashiko | B22D 17/24 165/185 |
| 6,216,343 | B1 * | 4/2001 | Leland | B21C 37/225 29/890.03 |

(Continued)

*Primary Examiner* — Claire Rojohn, III
(74) *Attorney, Agent, or Firm* — David L. Soltz; Harrity & Harrity LLP

(57) ABSTRACT

A method of fabricating a heat pipe may include providing a first material as a body section. The method may include stamping or etching the body section to include the cavity. A portion of the body section may constitute a wall of the cavity. The method may include stamping or etching the wall of the cavity to provide a set of corrugations on a portion of the wall of the cavity. The method may include forming an opening in the wall of the cavity. The method may include attaching a lid over the cavity. The lid constituting at least a portion of a hermetic seal of the cavity. The method may include attaching a cover to the body section approximately adjacent to the opening in the cavity. The method may include attaching a valve to the body section approximately at the opening to the cavity.

13 Claims, 12 Drawing Sheets

(56) References Cited

U.S. PATENT DOCUMENTS

| | | | | |
|---|---|---|---|---|
| 6,293,333 B1* | 9/2001 | Ponnappan | F28D 15/0233 | 165/104.26 |
| 6,411,512 B1* | 6/2002 | Mankaruse | H05K 7/20336 | 165/104.33 |
| 6,606,251 B1* | 8/2003 | Kenny, Jr. | G06F 1/26 | 257/E23.067 |
| 6,942,018 B2* | 9/2005 | Goodson | F04B 19/006 | 165/104.21 |
| 6,994,151 B2* | 2/2006 | Zhou | H01L 23/427 | 165/104.21 |
| 7,000,684 B2* | 2/2006 | Kenny | F04B 17/00 | 165/104.21 |
| 7,014,835 B2* | 3/2006 | Mathias | B01J 19/0093 | 422/198 |
| 7,017,654 B2* | 3/2006 | Kenny | F28F 3/086 | 165/104.33 |
| 7,029,647 B2* | 4/2006 | Tonkovich | B01J 19/0093 | 165/186 |
| 7,134,486 B2* | 11/2006 | Santiago | B01D 19/0031 | 165/104.28 |
| 7,156,159 B2* | 1/2007 | Lovette | F28F 3/12 | 165/104.33 |
| 7,188,662 B2* | 3/2007 | Brewer | H01L 23/473 | 165/80.4 |
| 7,201,012 B2* | 4/2007 | Munch | F04B 17/00 | 165/104.33 |
| 7,293,423 B2* | 11/2007 | Upadhya | F28F 3/12 | 165/146 |
| 7,591,302 B1* | 9/2009 | Lenehan | H01L 23/34 | 165/104.33 |
| 7,616,444 B2* | 11/2009 | Munch | H01L 23/40 | 165/104.33 |
| 7,746,634 B2* | 6/2010 | Hom | H05K 7/20736 | 165/104.33 |
| 7,806,168 B2* | 10/2010 | Upadhya | F04B 17/00 | 165/104.33 |
| 7,836,597 B2* | 11/2010 | Datta | F04B 17/00 | 165/104.33 |
| 7,900,692 B2* | 3/2011 | Miyahara | H01L 23/473 | 165/104.26 |
| 8,109,325 B2* | 2/2012 | Kroliczek | F28D 15/043 | 165/104.21 |
| 8,254,422 B2* | 8/2012 | Datta | C04B 37/026 | 372/34 |
| 8,383,872 B2* | 2/2013 | Tonkovich | B01F 3/0446 | 585/250 |
| 8,580,211 B2* | 11/2013 | Tonkovich | B01D 53/0438 | 422/603 |
| 8,703,984 B2* | 4/2014 | Mazanec | B01J 19/0093 | 422/198 |
| 8,716,050 B2* | 5/2014 | Wong | H01L 21/461 | 257/417 |
| 8,747,805 B2* | 6/2014 | Tonkovich | B01J 19/0093 | 423/644 |
| 8,857,234 B2* | 10/2014 | Meng | B81C 1/00071 | 72/197 |
| 9,006,298 B2* | 4/2015 | LeViness | B01J 23/8913 | 518/715 |
| 9,023,900 B2* | 5/2015 | Wang | B01J 23/75 | 502/325 |
| 9,120,190 B2* | 9/2015 | Schwartz | B23P 15/26 | |
| 9,150,494 B2* | 10/2015 | Tonkovich | B01F 5/0475 | |
| 9,157,687 B2* | 10/2015 | Schon | F28D 15/043 | |
| 9,179,577 B2* | 11/2015 | Moon | F28D 15/046 | |
| 2003/0035450 A1 | 2/2003 | He | H01S 5/02272 | 372/36 |
| 2005/0098305 A1* | 5/2005 | Lee | G06F 1/20 | 165/104.33 |
| 2005/0183847 A1* | 8/2005 | Wong | F28D 15/0233 | 165/104.33 |
| 2005/0280128 A1* | 12/2005 | Mok | H01L 23/427 | 257/678 |
| 2005/0280162 A1* | 12/2005 | Mok | H01L 23/427 | 257/778 |
| 2006/0036106 A1* | 2/2006 | Mazanec | B01J 19/0093 | 549/533 |
| 2006/0103288 A1* | 5/2006 | Sheng | H01J 1/3042 | 313/311 |
| 2006/0273709 A1* | 12/2006 | Liu | H01J 29/94 | 313/481 |
| 2006/0279197 A1* | 12/2006 | Liu | H01J 29/94 | 313/495 |
| 2007/0014148 A1* | 1/2007 | Zhou | B82Y 15/00 | 365/158 |
| 2007/0051965 A1* | 3/2007 | Du | B82Y 10/00 | 257/98 |
| 2007/0052338 A1* | 3/2007 | Du | H01J 3/022 | 313/310 |
| 2007/0063630 A1* | 3/2007 | Guo | B82Y 10/00 | 313/311 |
| 2007/0069631 A1* | 3/2007 | Guo | H01J 29/467 | 313/497 |
| 2007/0075622 A1* | 4/2007 | Guo | H01J 29/94 | 313/496 |
| 2007/0114475 A1* | 5/2007 | Qian | H01J 27/04 | 250/515.1 |
| 2007/0184320 A1* | 8/2007 | Domen | F01P 3/20 | 429/435 |
| 2007/0222356 A1* | 9/2007 | Qian | B82Y 10/00 | 313/311 |
| 2007/0222363 A1* | 9/2007 | Qian | B82Y 10/00 | 313/496 |
| 2007/0222364 A1* | 9/2007 | Qian | B82Y 10/00 | 313/496 |
| 2007/0296320 A1* | 12/2007 | Yao | H01J 3/022 | 313/309 |
| 2008/0007153 A1* | 1/2008 | Yang | H01J 31/12 | 313/496 |
| 2008/0018227 A1* | 1/2008 | Yang | H01J 31/123 | 313/497 |
| 2008/0214082 A1* | 9/2008 | Wei | H01J 9/025 | 445/24 |
| 2008/0216994 A1* | 9/2008 | Lee | F28D 15/0233 | 165/104.26 |
| 2008/0224711 A1* | 9/2008 | Yang | G01L 21/34 | 324/460 |
| 2008/0252195 A1* | 10/2008 | Liu | H01J 1/304 | 313/496 |
| 2008/0278060 A1* | 11/2008 | Liu | H01J 29/28 | 313/496 |
| 2008/0280083 A1* | 11/2008 | Qiu | C25D 3/12 | 428/35.8 |
| 2008/0280114 A1* | 11/2008 | Tang | B44F 1/06 | 428/210 |
| 2008/0297989 A1* | 12/2008 | Wang | H04M 1/0283 | 361/600 |
| 2010/0038660 A1* | 2/2010 | Shuja | H01L 33/648 | 257/98 |
| 2010/0052174 A1* | 3/2010 | Bachman | H01L 24/05 | 257/762 |
| 2011/0052117 A1* | 3/2011 | Tsai | G02B 6/12019 | 385/14 |
| 2011/0074274 A1* | 3/2011 | Tang | H01J 1/304 | 313/296 |
| 2011/0101845 A1* | 5/2011 | Hao | H01J 29/04 | 313/310 |
| 2011/0237148 A1* | 9/2011 | Hao | H01J 1/304 | 445/23 |
| 2011/0258999 A1* | 10/2011 | Ingersoll | F28D 15/00 | 60/512 |
| 2011/0290451 A1* | 12/2011 | Kim | F28D 15/0233 | 165/104.26 |
| 2012/0037206 A1* | 2/2012 | Norman | F28D 15/0233 | 136/246 |
| 2012/0153802 A1* | 6/2012 | Tang | H01J 1/304 | 313/310 |
| 2012/0161606 A1* | 6/2012 | Hao | H01J 29/04 | 313/306 |

(56) References Cited

U.S. PATENT DOCUMENTS

| | | | | |
|---|---|---|---|---|
| 2012/0261104 A1* | 10/2012 | Kelly | B23K 1/0012 | 165/177 |
| 2013/0092353 A1* | 4/2013 | Yang | F28D 15/04 | 165/104.26 |
| 2013/0213603 A1* | 8/2013 | Connors | F28F 3/00 | 165/76 |
| 2014/0054009 A1* | 2/2014 | Chang | F28F 3/00 | 165/104.11 |
| 2014/0231055 A1* | 8/2014 | Schalansky | F28F 3/086 | 165/166 |
| 2014/0262186 A1* | 9/2014 | Kandlikar | F28F 13/08 | 165/177 |
| 2015/0198372 A1* | 7/2015 | Desikan | F28D 1/0366 | 165/151 |
| 2016/0131432 A1* | 5/2016 | Neumann | F28D 9/0093 | 165/166 |
| 2016/0171648 A1* | 6/2016 | Thibault | G01N 23/046 | 378/5 |
| 2016/0290734 A1* | 10/2016 | Osenbach | F28D 15/02 | |

* cited by examiner

LOW-COST NANO-HEAT PIPE

BACKGROUND

A heat pipe may be utilized to dissipate heat of a module, such as an integrated circuit, a diode, a voltage control device, a driver circuit, a processor, or the like. The heat pipe may include a cavity, partially filled with a working fluid to facilitate movement of heat from a first end of the heat pipe to a second end of the heat pipe. For example, the working fluid may undergo a first phase transition into a vapor at a high heat interface at the first end of the heat pipe, a movement to a low heat interface at the second end of the heat pipe, a second phase transition into a liquid at the low heat interface, and a return movement to the high heat interface at the first end of the heat pipe.

SUMMARY

According to some possible implementations, a method of fabricating a heat pipe may include providing a first material as a body section. The method may include stamping or etching the body section to include the cavity. A portion of the body section may constitute a wall of the cavity. The method may include stamping or etching the wall of the cavity to provide a set of corrugations on a portion of the wall of the cavity. The method may include forming an opening in the wall of the cavity. The opening may be configured to receive a fluid. The method may include attaching a lid over the cavity. The lid constituting at least a portion of a hermetic seal of the cavity. The method may include attaching a cover to the body section approximately adjacent to the opening in the cavity. The method may include attaching a valve to the body section approximately at the opening to the cavity.

According to some possible implementations, a heat pipe device may include a body section having a set of body section surfaces. The set of body section surfaces may include a top surface, a bottom surface, and a set of body section side surfaces. The body section may include a cavity extending from the top surface toward the bottom surface. The cavity may include a bottom surface and a set of cavity side surfaces. The cavity may be covered by a lid attaching to the top surface of the body section. The cavity may have an opening into the body section. The opening may extend to a particular surface of the set of body section surfaces. The cavity may be hermetically sealable by the lid, the body section, and a cover that covers the opening into the body section. The bottom surface of the cavity including a set of corrugations.

According to some possible implementations, a heat pipe may include a body section. The body section may be at least partially covered by a lid that is less than approximately 35 square millimeters in size. The lid may cover a cavity in the body section. The cavity may have a corrugated bottom surface. The corrugated bottom surface may have multiple corrugations. Each corrugation, of the multiple corrugations, may be less than approximately 0.75 millimeters in height and may be separated from one or more other corrugations, of the multiple corrugations, by less than approximately 0.1 millimeters.

DETAILED DESCRIPTION

The following detailed description of example implementations refers to the accompanying drawings. The same reference numbers in different drawings may identify the same or similar elements.

A heat pipe may be utilized to dissipate thermal energy from an area of a module and transfer the thermal energy to another area of a module. For example, the heat pipe may transfer thermal energy from a first, high heat area of a module to a second, low heat area of a module (the first, high heat area being termed high heat in comparison to the second, low heat area). The heat pipe may be evacuated to a near-vacuum (e.g., a vacuum, a near-vacuum, such as an atmospheric pressure of less than approximately 0.1 atmospheres (atm), or the like), and may be partially filled with a working fluid, such as water, ammonia, or the like. The working fluid may undergo a first phase transition at a high heat interface from a liquid state to a gaseous state and may undergo a second phase transition at a low heat interface from the gaseous state to the liquid state. While in the gaseous state, the working fluid may move from the high heat interface to the low heat interface, thereby transferring heat form the high heat area of the module to the low heat area of the module. While in the liquid state, the working fluid may move from the low heat interface to the high heat interface.

A particular configuration of a heat pipe may use a porous material, such as silicon, to increase movement from the low heat interface to the high heat interface by capillary action, thereby increasing heat transfer by the heat pipe. However, the particular configuration may limit the types of material used, may be expensive, may be difficult to evacuate to a near-vacuum, and may be difficult to construct. Implementations, described herein, may facilitate heat exchange for a module by using a low-cost nano-scale heat pipe.

Figure 1:
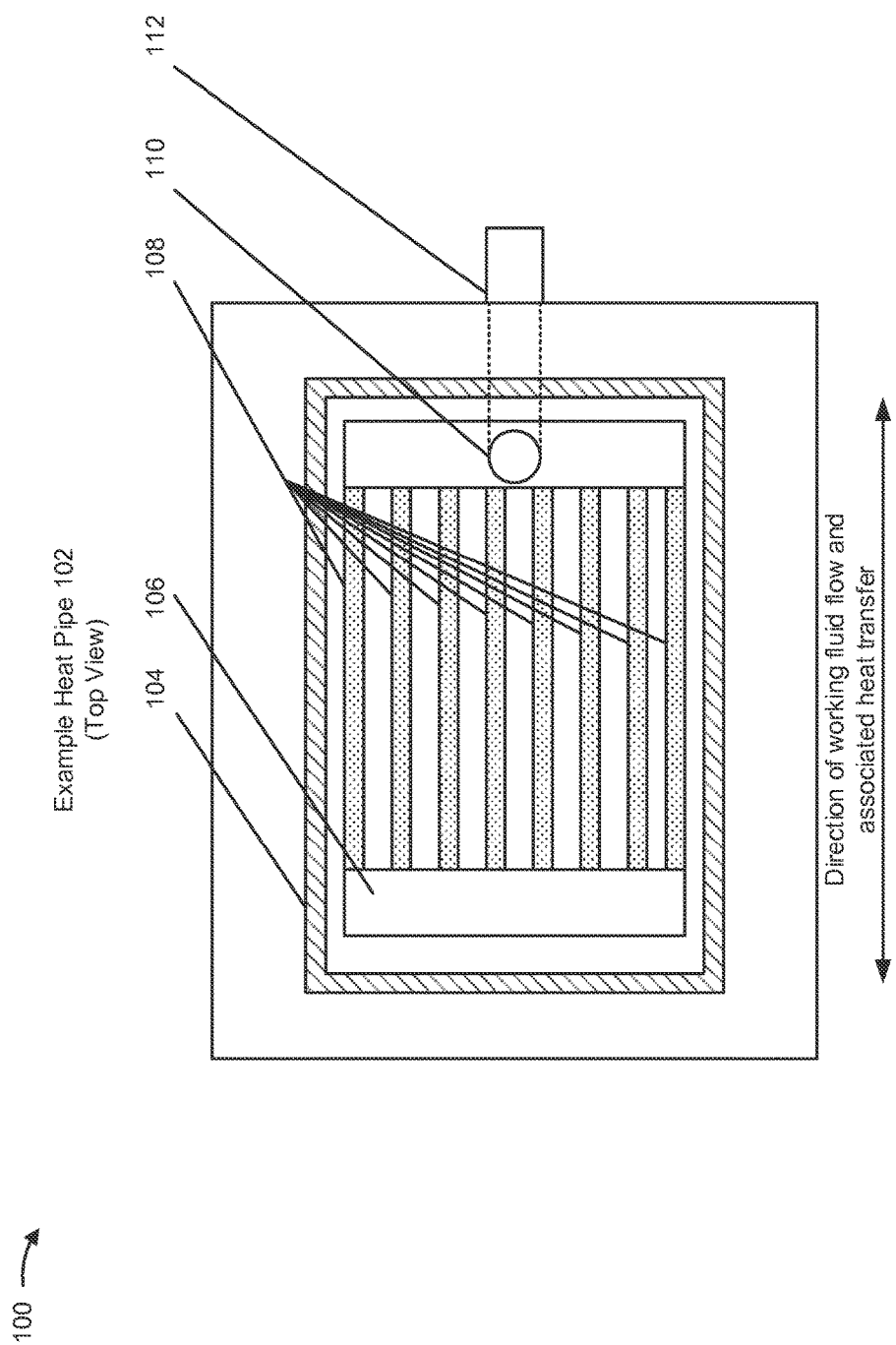
FIG. 1 is a diagram of an overview of an example implementation described herein.

FIG. 1 is a diagram of an overview of an example implementation 100 described herein. A heat pipe body section 102 may be attached to a lid (not shown) at an attachment location 104. For example, the lid may be soldered, welded, or the like to the heat pipe to form a hermetic seal over a cavity 106 inside heat pipe body section 102. The lid may absorb heat from a module, and may transfer the heat to a working fluid in cavity 106 via heat pipe body section 102. Cavity 106 may include one or more corrugations 108 (hereinafter referred to collectively as "corrugations 108," and individually as "corrugation 108") formed at the bottom surface of the cavity (bottom with respect to the top surface of heat pipe body section 102 to which the lid is attached. Corrugations 108 may be stamped into the bottom surface of cavity 106, etched into the bottom surface of cavity 106, affixed to the bottom surface of cavity 106, or the like. Corrugations 108 may facilitate capillary motion moving a working fluid in a direction substantially parallel to corrugations 108, thereby facilitating heat transfer in the direction substantially parallel to corrugations 108.

The working fluid may partially fill cavity 106, and the working fluid may move, in a liquid state and with the assistance of capillary motion caused by corrugations 108, from a low temperature area of heat pipe body section 102 to a high temperature area of heat pipe body section 102. The low temperature area of heat pipe body section 102 may be termed a condenser end. The high temperature area of heat pipe body section 102 may be termed an evaporator end. Cavity 106 may include an opening 110 that may extend from a first end at a bottom surface of cavity 106 into heat pipe body section 102 toward a second end at a side surface of heat pipe body section 102. Affixed to heat pipe body section 102 at the second end associated with opening 110 may be one or more flanges 112 (hereinafter referred to collectively as "flanges 112," and individually as "flange 112"). After cavity 106 is evacuated to a vacuum state and the working fluid is injected into cavity 106 via the second end associated with opening 110, flanges 112 may be bent, crimped, or the like to cover the second end of opening 110 to form, in association with the lid and heat pipe body section 102, a hermetic seal of cavity 106.

Figure 2A:
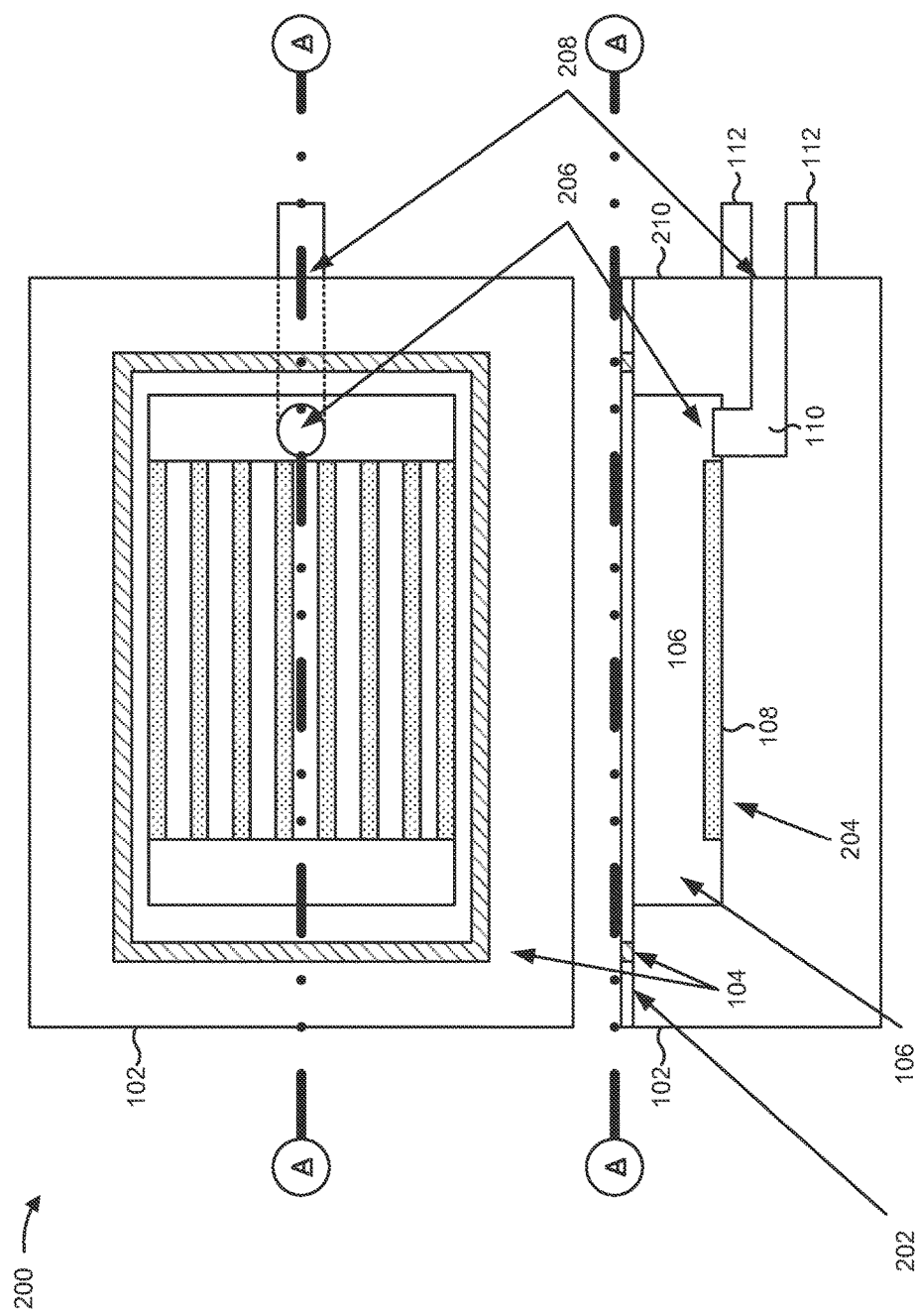
FIGS. 2A-2C are diagrams of an example heat pipe with corrugated channels to promote capillary movement of a working fluid.
Figure 2B:
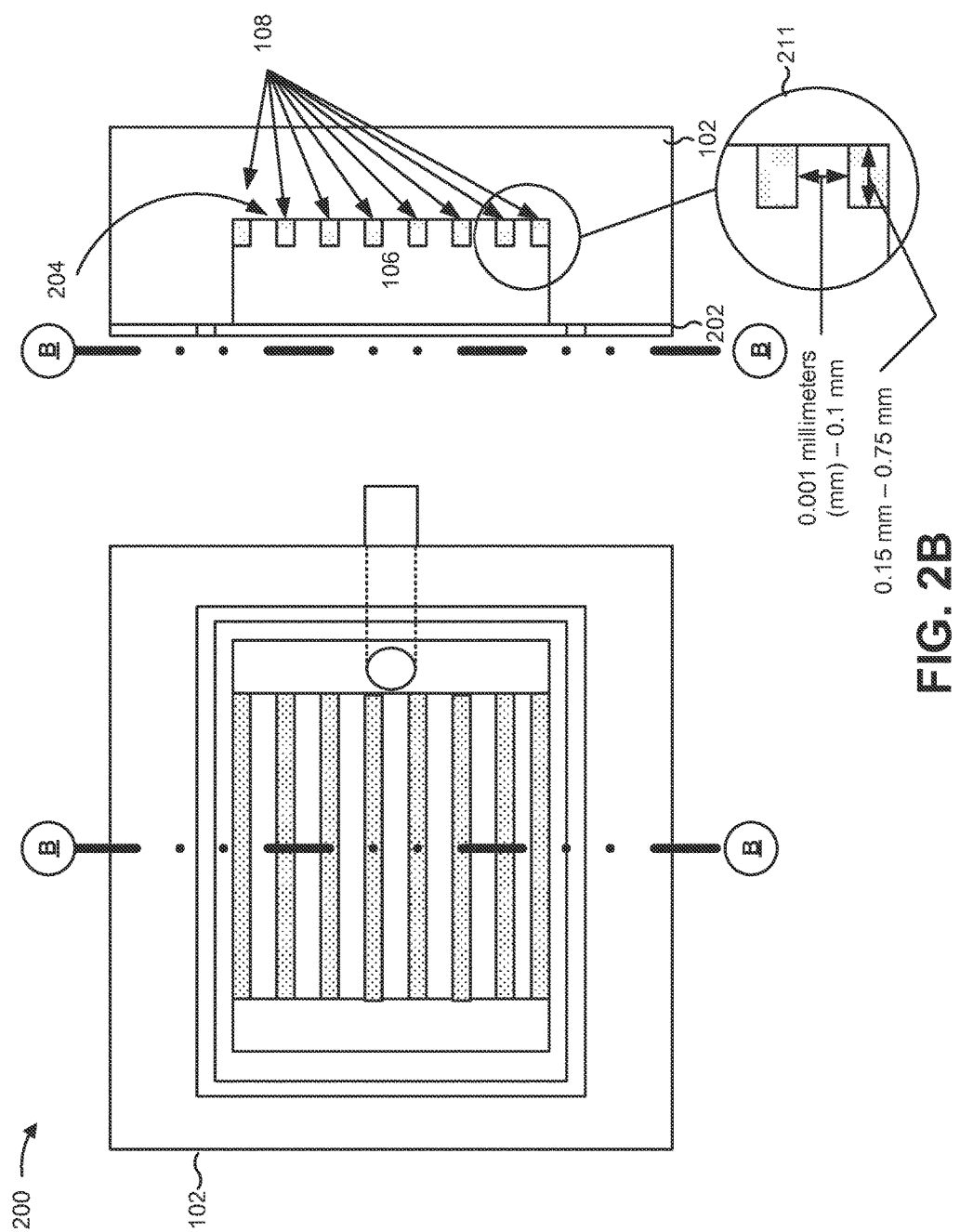
Figure 2C:
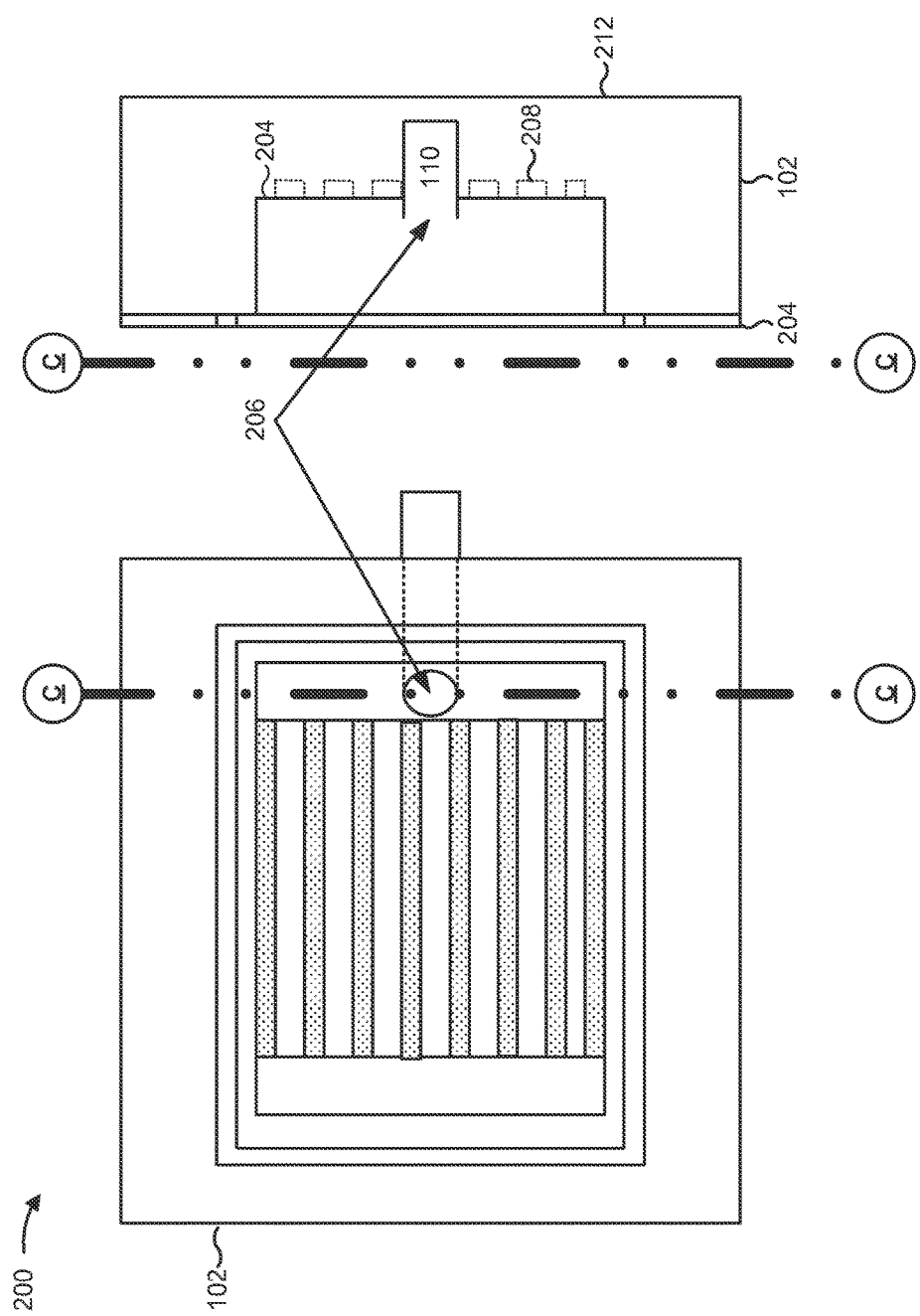

FIGS. 2A-2C are diagrams of an example implementation 200 of an example heat pipe with corrugated channels to promote capillary movement of a working fluid.

FIG. 2A is a diagram illustrating a first cross-section view of an example heat pipe with corrugated channels to promote capillary movement of a working fluid. The first cross-section view shown in FIG. 2A conceptually illustrates a layout of a heat pipe. As shown by reference number 202, lid 202 may attach to heat pipe body section 102 at attachment location 104. For example, lid 202 may be affixed to heat pipe body section 102 by a welding process performed at attachment location 104. Lid 202 may form a hermetic seal with heat pipe body section 102 covering cavity 106. As shown by reference number 204, cavity 106 includes a corrugation 108 connected to bottom surface 204. For example, corrugation 108 may be etched into bottom surface 204, stamped on bottom surface 204, affixed to bottom surface 204, or the like. As shown by reference number 206, opening 110 may extend from end 206 at bottom surface 204 at cavity 106 to end 208 at side surface 210 between flanges 112.

FIG. 2B is a diagram illustrating a second cross-section view of an example heat pipe with corrugated channels to promote capillary movement of a working fluid. The second cross-section view shown in FIG. 2B conceptually illustrates a layout of a heat pipe. As shown in FIG. 2B, corrugations 108 may be associated with a particular shape pathway substantially parallel to which a working fluid is moved based on capillary movement. For example, corrugations 108 may include a rectangular cross-section pathway (as shown), a v-shaped cross-section pathway (not shown), a u-shaped cross section pathway (not shown), or the like.

As further shown in FIG. 2B, and by call-out 211, a set of example dimension ranges relating to corrugations 108 are shown. For example, corrugations 108 may extend from bottom surface 204 by approximately 0.15 millimeters (mm) to approximately 0.75 mm and corrugations 108 may be spaced by approximately 0.001 mm to approximately 0.1 mm (based on a desired capillary motion of the working fluid). In some implementations, corrugations 108 may be spaced evenly. Additionally, or alternatively, a first corrugation 108 and a second corrugation 108 may be spaced by a first distance and the second corrugation 108 and a third corrugation 108 may be spaced by a second distance. Although corrugations 108 are shown in terms of the set of example dimensions, different dimensions are possible from what is shown in FIG. 2B.

In some implementations, one or more dimensions and/or cross-section shapes of the pathway may be selected based on a material from which corrugations 108 are formed, a working fluid chosen for the heat pipe, a desired heat flux of the heat pipe, or the like. For example, when a particular material and a particular working fluid are selected, a particular set of dimensions and a particular cross-section shape may be selected to maximize capillary movement compared with other sets of dimensions and other cross-section shapes. By increasing capillary movement, a heat flux associated with the heat pipe may be increased relative to another heat pipe lacking corrugations 108.

FIG. 2C is a diagram illustrating a third cross-section view of an example heat pipe with corrugated channels to promote capillary movement of a working fluid. The third cross-section view shown in FIG. 2C conceptually illustrates a layout of a heat pipe. As shown in FIG. 2C, end 206 of opening 110 may extend above bottom surface 204. For example, when manufacturing the heat pipe, a quantity of material may be removed from bottom surface 204 surrounding end 206 of opening 110, thereby resulting in end 206 extending upward toward lid 202 from bottom surface 204. As further shown in FIG. 2C, corrugations 108 extend into bottom surface 204 toward a bottom surface 212 of heat pipe body section 102 (e.g., based on stamping bottom surface 204, etching bottom surface 204, or the like).

FIGS. 2A-2C illustrate one example design for a heat pipe. In some implementations, the heat pipe may include, for example, different quantities/sizes of corrugations 108, differently shaped corrugations 108, or the like. Additionally, or alternatively, the heat pipe may be associated with different dimensions and/or surfaces than those shown in FIGS. 2A-2C.

Figure 3:
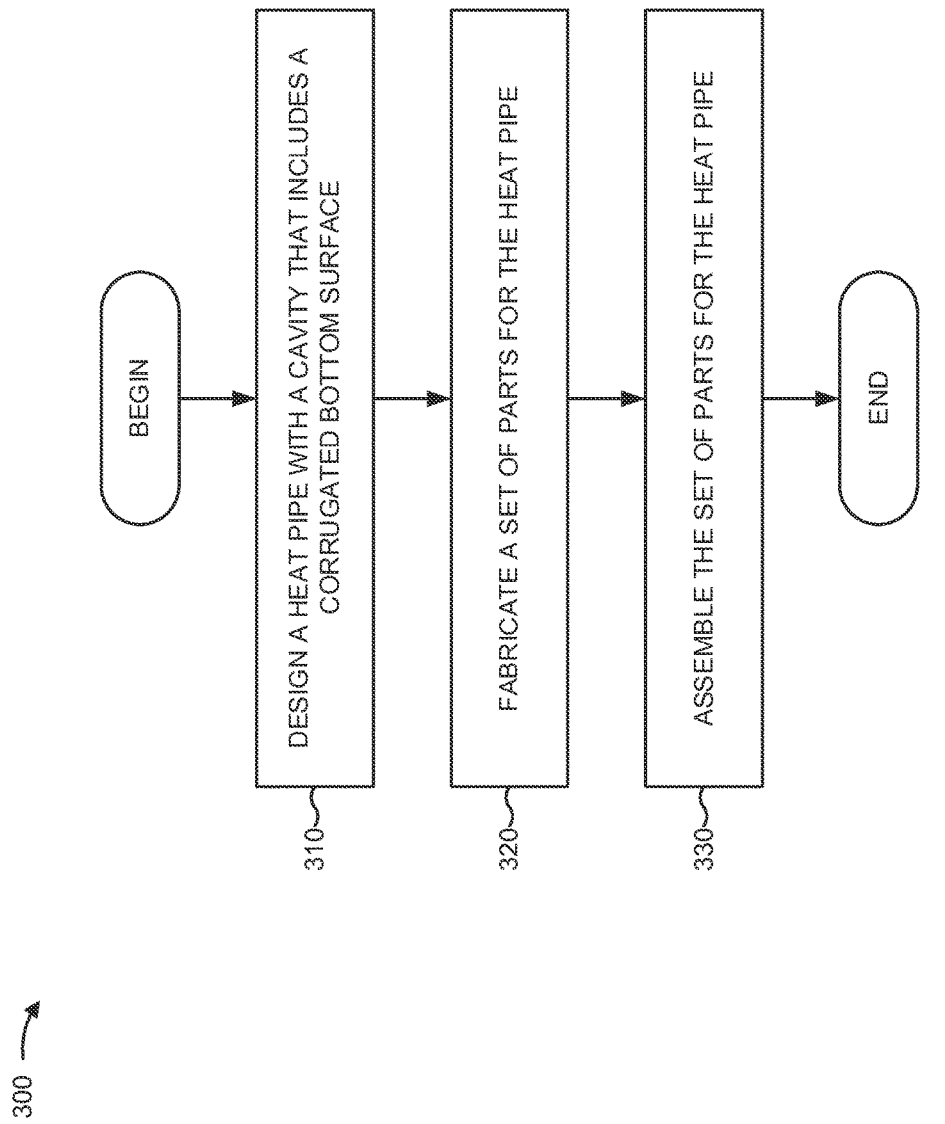
FIG. 3 is a flow chart of an example process for fabricating and assembling a heat pipe with corrugated channels to promote capillary movement of a working fluid.

FIG. 3 is a flow chart illustrating an example process 300 for fabricating and assembling a heat pipe with corrugated channels to promote capillary movement of a working fluid. Process 300 may be applied to the design of a heat pipe used to perform heat exchange for a module, such as an integrated circuit, a diode, a processor, or the like.

Process 300 may include designing a heat pipe with a cavity that includes a corrugated bottom surface (block 310). For example, the heat pipe may be designed to include a cavity with a corrugated bottom surface. In some implementations, the cavity may extend from a top surface of the heat pipe toward the bottom surface of the heat pipe (top being relative to a module that attaches to the heat pipe and for which heat transfer is performed). For example, the cavity may be designed with a particular set of dimensions specifying a depth of the cavity from the top surface of the heat pipe. In some implementations, dimensions of the cavity may be selected based on one or more factors. For example, the volume of the cavity may be selected based on a desired heat flux for the heat pipe. In some implementations, the cavity may be designed to be covered by a lid. For example, the lid may be affixed to the top surface of the heat pipe (e.g., by welding, soldering, brazing, or the like) to form a hermetic seal closing off the top of the cavity.

The cavity may be designed to include a bottom surface that is corrugated, in some implementations. For example, the cavity may be designed to include one or more corrugated channels that are stamped into the bottom surface of the cavity, one or more corrugated channels that are etched into the bottom surface of the cavity, one or more corrugated channels that are affixed to the bottom surface of the cavity, or the like. Additionally, or alternatively, the bottom surface of the cavity may be designed as a corrugated bottom surface. For example, when some or all of the heat pipe is to be manufactured by a three-dimensional printing method, layers of the heat pipe may be generated by a three-dimensional printer so that the cavity is formed with the one or more corrugated channels forming the bottom surface of the cavity.

Designing the heat pipe may include selecting a set of materials for the heat pipe, in some implementations. For example, the heat pipe may be manufactured from a machinable material, such as silver, copper, aluminum, silicon, a composite material, a combination of two or more materials, or the like. In some implementations, the material may be selected based on a heat transfer coefficient of the material. For example, the material of the heat pipe may be a material associated with a comparatively high thermal conductivity, such as silver, copper, aluminum, or the like (e.g., a high thermal conductivity as compared with another material, such as a silicon-based composite, which has a lower thermal conductivity). In this way, the heat pipe may be associated with a comparatively high heat flux. In this case, a material with a thermal conductivity greater than 50 watts per meter-kelvin (W/m-K) may be particularly useful and a thermal conductivity greater than 100 W/m-K may be even more useful.

Additionally, or alternatively, a material with a lesser thermal conductivity may also be utilized for the heat pipe. For example, the material of the heat pipe may be a material associated with a comparatively low thermal conductivity and correspondingly low coefficient of thermal expansion, such as silicon, or a composite material (e.g., low as compared with a coefficient of thermal expansion of another material, such as copper, which has a higher coefficient of thermal expansion). In this way, the heat pipe may be attached to a module constructed from a material with a coefficient of thermal expansion that approximates that of the module, thereby reducing potential damage during thermal expansion. For example, the heat pipe may utilize a material with a coefficient of thermal expansion between approximately 3 parts per million per degree Celsius (ppm/° C.) to approximately 7 ppm/° C. Based on capillary movement caused by the corrugations increasing heat flux of the heat pipe, a threshold level of heat flux associated with preventing damage to the module may be attained despite the low thermal conductivity associated with a material with a low coefficient of thermal expansion.

Designing the heat pipe may include designing a seal for an opening in the cavity, in some implementations. For example, the heat pipe may be designed with one or more flanges and a valve associated with evacuating air from the heat pipe, injecting working fluid into the heat pipe, and sealing the heat pipe. When the flanges are in an open position, the cavity may be evacuated and/or filled, and when the flanges are in a closed position, the cavity may be hermetically sealed. In some implementations, the flange may be an adjustable flange. For example, the flange may be designed to allow the opening to be opened or sealed. Additionally, or alternatively, the heat pipe may be designed without a flange, and may include another type of seal for the opening, such as a plug, a cover, or the like.

Additionally, or alternatively, a valve may be designed, which may facilitate evacuation of the cavity to form a near-vacuum (e.g., a near-vacuum, a vacuum, or the like) and partial filling of the cavity with a working fluid. In some implementations, the valve may be integrated into the heat pipe. For example, the valve may be affixed to the heat pipe at or near an opening in the heat pipe (e.g., end 208 of opening 110). Additionally, or alternatively, the valve may be designed as being removable from the heat pipe. In some implementations, the valve may be associated with a vacuum pump, a working fluid injector, or the like.

Process 300 may further include fabricating a set of parts for the heat pipe (block 320). For example, the set of parts for the heat pipe may be fabricated based on the design of the heat pipe. In some implementations, the heat pipe may be fabricated as a monolithic heat pipe. For example, the heat pipe may be printed using a three-dimensional printer based technique (e.g., an extrusion technique). In this case, corrugations on a surface of the cavity may be formed using the three-dimensional printer. Additionally, or alternatively, the heat pipe may be fabricated using an injection molding technique, an electrical discharge machining (EDM) technique, a stamping technique, an etching technique, a powder metallurgy technique, or the like. For example, the heat pipe may be fabricated using a diamond etched stamping tool, a diamond etching tool, or the like. In some implementations, the heat pipe may be fabricated in a thermally insulated environmental enclosure that facilitates temperature control of the heat pipe during fabrication. In some implementations, the heat pipe may be fabricated as a set of multiple parts for assembly. For example, multiple parts of the heat pipe may be separately manufactured using a fabrication technique, such as by printing, injection molding, stamping, etching, or the like.

In some implementations, the heat pipe may be fabricated from a first material (e.g., copper, aluminum, or the like) by stamping or etching the first material to form a cavity and stamping or etching the material (e.g., with the same tool, with a different tool, or the like) to form a set of corrugations in the cavity.

In some implementations, the corrugations may be attached to a cavity portion of the heat pipe after fabrication. For example, a corrugated surface may be fabricated and may be affixed to a bottom surface of the cavity portion of the heat pipe during assembly. Additionally, or alternatively, the corrugations may be fabricated from the cavity portion of the heat pipe. For example, the heat pipe may include a cavity that is stamped with a set of corrugated channels at the bottom surface of the cavity. In some implementations, the corrugations may be stamped or etched into the cavity. For example, when the cavity is stamped or etched, the corrugations may be stamped or etched into a wall of the cavity (e.g., a bottom of the cavity).

In some implementations, an opening in the heat pipe may be fabricated to facilitate evacuation of air and injection of a working fluid. For example, an opening may be fabricated from the cavity to the side of the heat pipe using a milling technique. Additionally, or alternatively, one or more other fabrication techniques, such as a micro-fabrication technique, a nano-fabrication technique, or the like, may be utilized to fabricate the heat pipe using one or more selected materials based on the design. In some implementations, the opening may be stamped into the body section into which the cavity is formed. For example, when a cavity is stamped into a body section, an opening may be stamped into a surface of the cavity.

Process 300 may further include assembling the set of parts for the heat pipe (block 330). For example, multiple parts of the heat pipe may be assembled. In some implementations, the multiple parts may be soldered, welded, brazed, or the like. For example, the lid may be welded to a body section (e.g., formed from a first material, such as by stamping the first material to produce a body section) that includes the cavity to hermetically seal the cavity.

In some implementations, assembling the parts may include attaching a cover and/or a valve to a body section of the heat pipe. For example, a flange may be welded to the heat pipe and a valve inserted into the opening to facilitate filling the cavity with a fluid (e.g., a working fluid). In some implementations, assembling the parts may include manipulating a cover of an opening to the cavity. For example, when the cavity includes an opening for evacuating the cavity and injecting working fluid into the cavity, after the working fluid is injected, a flange may be configured to hermetically seal the opening, such as by bending the flange, welding the flange to another part, or the like. In some implementations, assembling the set of parts may include mounting a module to the heat pipe. For example, a module, such as an integrated circuit, a diode, or the like, may be welded, soldered, brazed, adhered, or the like to the heat pipe to facilitate dissipation of heat from the module.

As indicated above, FIG. 3 is provided merely as an example. Other examples are possible and may differ from what was described with regard to FIG. 3.

Figure 4A:
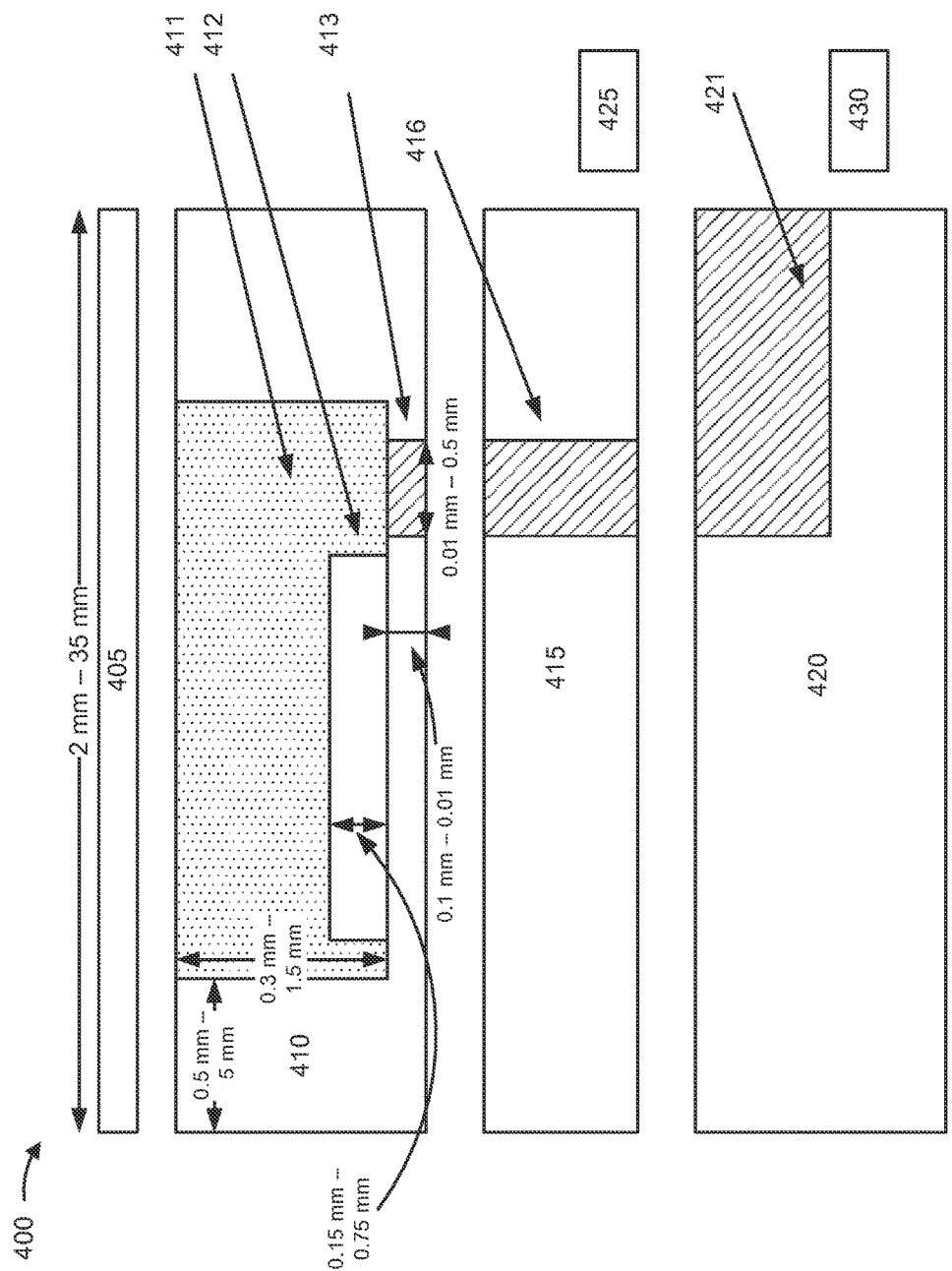
FIGS. 4A and 4B are diagrams of an example implementation relating to the example process shown in FIG. 3.
Figure 4B:
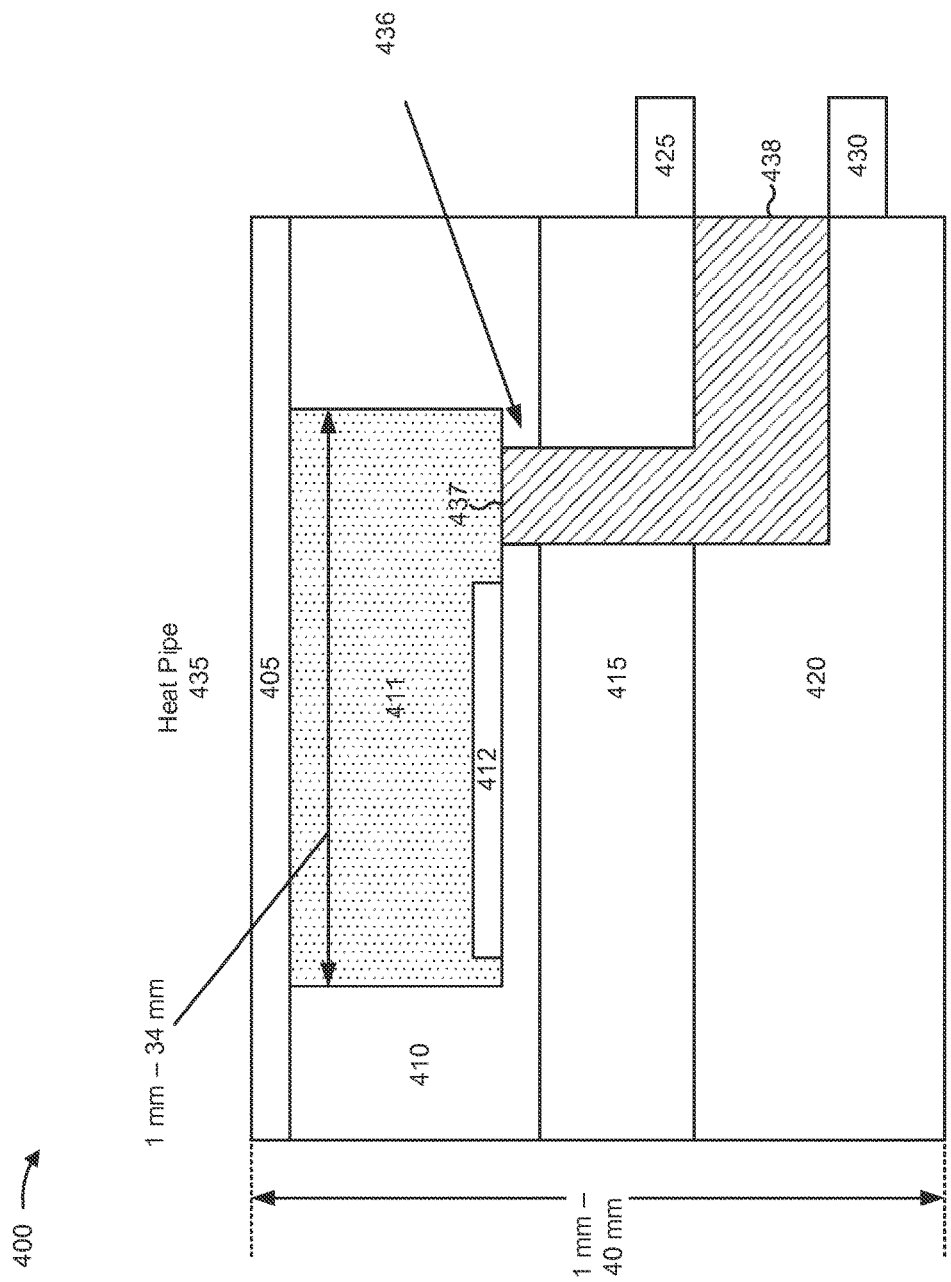

FIGS. 4A and 4B are diagrams of an example implementation 400 relating to example process 300 shown in FIG. 3. FIGS. 4A and 4B show an example of fabricating and assembling a heat pipe with corrugated channels to promote capillary movement of a working fluid.

As shown in FIG. 4A, a set of parts may be fabricated for a heat pipe. The set of parts may include lid 405; body portion 410 (which includes cavity 411, corrugations 412, and opening portion 413); body portion 415 (which includes opening portion 416); body portion 420 (which includes portion opening 421); flange 425; and flange 430.

As further shown in FIG. 4A, a set of example dimension ranges are illustrated for selected portions of the set of parts. For example, lid 405 may extend lengthwise by approximately 2 mm to approximately 35 mm in each direction. Cavity 411 may be associated with a depth of approximately 0.3 mm to approximately 1.5 mm. Corrugations 412 may be associated with a height of approximately 0.15 mm to approximately 0.75 mm. Body portion 410 may be associated with a wall thickness enclosing cavity 411 of approximately 0.5 mm to approximately 5 mm. Body portion 410 may be associated with a wall thickness below cavity 411 of approximately 0.1 mm to approximately 0.01 mm. Opening portion 412 may be associated with a diameter of approximately 0.01 mm to approximately 0.5 mm. Although a particular set of example dimension ranges are illustrated, other dimensions less than or greater than the example dimensions shown in FIG. 4A are possible. Additionally, or alternatively, different combinations of dimensions are possible than what is show in FIG. 4A.

As shown in FIG. 4B, the set of parts may be affixed to form heat pipe 435. As shown in FIG. 4B, lid 405 is affixed to body portion 410. Similarly, body portion 410 is affixed to lid 405 and to body portion 415. Similarly, body portion 415 is affixed to body portion 410 and body portion 420. Similarly, flange 425 and flange 430 are affixed to body portion 415 and body portion 420, respectively. In some implementation, parts of heat pipe 435 may be affixed using a welding technique (e.g., laser welding), a soldering technique, a brazing technique, or the like.

As further shown in FIG. 4B, and by reference number 436, opening portion 413, opening portion 416, and opening portion 421 are aligned to form a continuous opening 436 from first opening end 437 to second opening end 438. In some implementations, cavity 411 may be evacuated and partially filled with a working fluid through opening 436 by a pump device attached to a valve that is attached at second opening end 438. In some implementations, opening portion 413, opening portion 416, and opening portion 421 may be positioned in semi-alignment (e.g., alignment to within a particular tolerance) to facilitate air evacuation and working fluid injection without requiring overly precise tools, fabrication techniques, assembly techniques, or the like, thereby reducing cost and complexity.

As further shown in FIG. 4B, a set of example dimension ranges are illustrated for selected portions of the set of parts. For example, cavity 411 may be associated with a width of approximately 1 mm to approximately 34 mm in each direction. Heat pipe 435 may be associated with a depth of approximately 1 mm to approximately 40 mm. Although a particular set of example dimension ranges are illustrated, other dimensions less than or greater than the example dimensions shown in FIG. 4B are possible. Additionally, or alternatively, different combinations of dimensions are possible than what is show in FIG. 4B.

As indicated above, FIGS. 4A and 4B are provided merely as an example. Other examples are possible and may differ from what was described with regard to FIGS. 4A and 4B.

Figure 5:
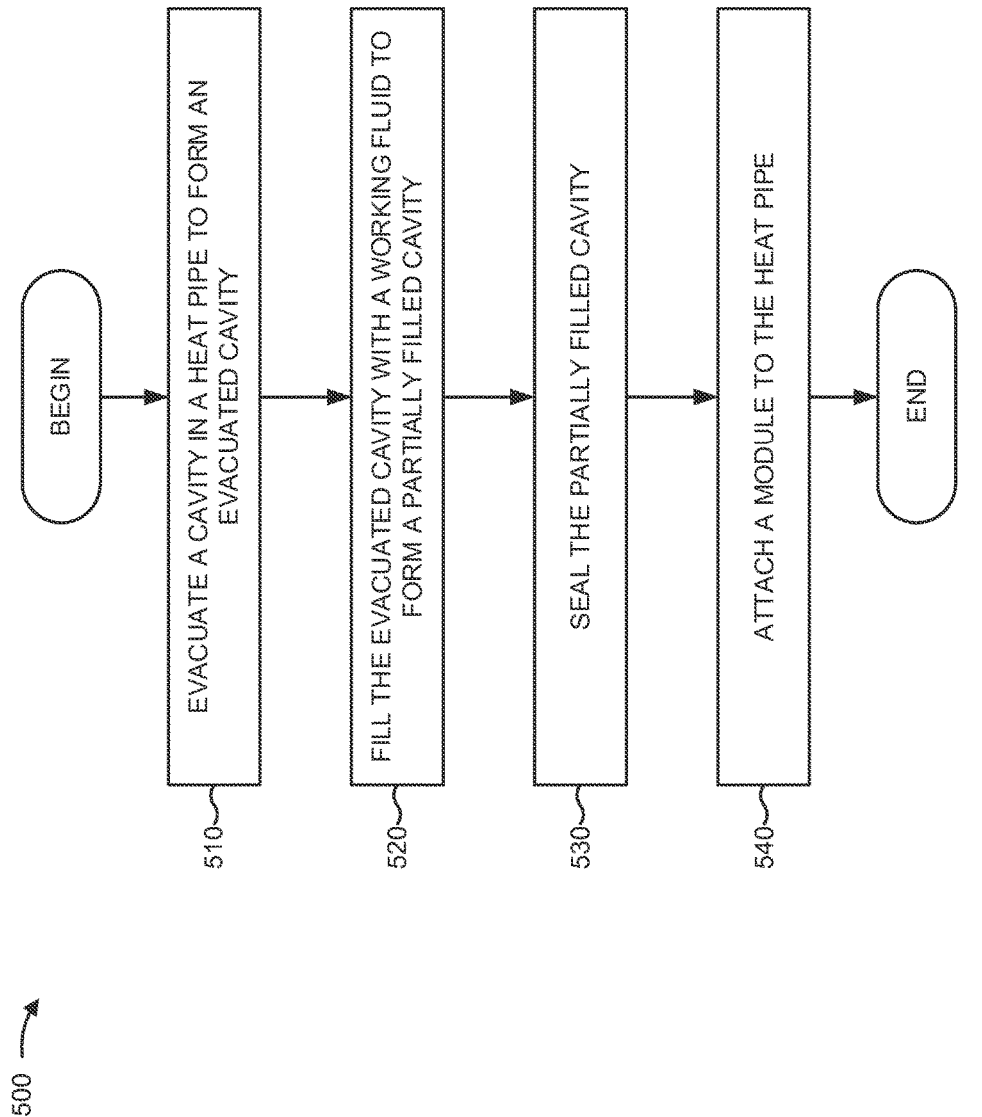
FIG. 5 is a flow chart of an example process for operating a heat pipe with corrugated channels to promote capillary movement of a working fluid.

FIG. 5 is a flow chart illustrating an example process 500 for operating a heat pipe with corrugated channels to promote capillary movement of a working fluid.

Process 500 may include evacuating a cavity in a heat pipe to form an evacuated cavity (block 510). For example, the cavity of the heat pipe may be evacuated through an opening in the cavity. In some implementations, the cavity may be evacuated through a valve.

For example, a vacuum pump may be attached to a valve at the opening of the cavity and may create a vacuum in the cavity. In some implementations, the cavity may be evacuated to a particular atmospheric pressure. For example, it may be beneficial to evacuate the cavity to a pressure at or near 0.1 atmospheres (atm) and it may be more beneficial to evacuate the cavity to a pressure less than 0.1 atm.

Process 500 may further include filling the evacuated cavity with a working fluid to form a partially filled cavity (block 520). For example, the evacuated cavity may be filled with the working fluid. In some implementations, the working fluid may be selected based on a desired heat flux for the heat pipe. For example, based on the desired heat flux, water, ammonia, acetone, a refrigerant, or the like may be selected as the working fluid and may be injected into the evacuated cavity. In some implementations, the evacuated cavity may be filled with a particular quantity of the working fluid. For example, the cavity may be filled with a quantity of the working fluid selected based on the desired heat flux for the heat pipe. Additionally, or alternatively, the cavity may be filled with a quantity of the working fluid selected based on a size of the corrugations. For example, the cavity may be filled to a level below the top of the corrugations. Additionally, or alternatively, the cavity may be filled to a level at or near the top of the corrugations. Additionally, or alternatively, the cavity may be filled to a level above the top of the corrugations.

In some implementations, filling the evacuated cavity may include adjusting a valve. For example, when a valve is attached to an opening of the cavity and the valve is utilized to evacuate the cavity, the valve may be adjusted to allow the working fluid to be injected into the cavity by an injector, a pump, or the like. In some implementations, the heat pipe may be brought to an elevated temperature when filling the evacuated cavity (elevated in comparison to a baseline temperature, such as room temperature, or the like). For example, the heat pipe may be brought to a particular temperature at which a portion of the working fluid is in a vapor state and another portion of the working fluid is in a liquid state, and the working fluid may be injected into the heat pipe while the heat pipe is at the particular temperature. In this case, the partially filled cavity may be hermetically sealed while at the particular temperature, while at another particular temperature, or the like.

Process 500 may further include sealing the partially-filled cavity (block 530). For example, the partially filled cavity may be hermetically sealed to maintain the working fluid in the cavity. Additionally, or alternatively, the partially filled cavity may be sealed to form a near hermetic seal (e.g., a slightly less than fully hermetic seal). In some implementations, the partially filled cavity may be sealed by sealing the opening to the partially filled cavity. For example, a valve at the opening to the partially filled cavity may be adjusted to a closed position, a set of flanges may be configured to cover the opening, a seal or cover may be affixed to the opening, or the like. In some implementations, the set of flanges at the opening may be bent, soldered, welded, or the like into a position that seals the opening. In some implementations, the set of flanges may be bent and adhered, such as by being bent and welded, bent and soldered, or the like to form a seal on the opening.

Process 500 may further include attaching a module to the heat pipe (block 540). For example, a module may be attached to the heat pipe using a welding technique, a soldering technique, a brazing technique, an adhesive technique, a pressure technique, or the like. Additionally, or alternatively, the module may be disposed onto the heat pipe without being attached. For example, the module may be positioned on a top surface of the lid (e.g., the top surface being relative to a bottom surface of the lid that is associated with hermetically sealing the partially filled cavity). In some implementations, the heat pipe may be attached to an integrated circuit module (e.g., a power integrated circuit), a voltage control module, a driver circuit module (e.g., an analog driver circuit), a processor module (e.g., a computer processor), or the like. For example, the heat pipe may be attached to an integrated circuit module ranging to approximately tens of nanometers in size in each dimension. Based on attaching the module to the heat pipe, the heat pipe may perform heat transfer for the module. For example, the heat pipe may utilize convective motion of the working fluid promoted by capillary movement promoted by the corrugated channels to cause heat to be moved from a first portion of the module to a second portion of the module.

As indicated above, FIG. 5 is provided merely as an example. Other examples are possible and may differ from what was described with regard to FIG. 5.

FIGS. 6A-6D are diagrams of an example implementation 600 relating to example process 500 shown in FIG. 5. FIGS. 6A-6D show an example of operating a heat pipe with corrugated channels to promote capillary movement of a working fluid.

Figure 6A:
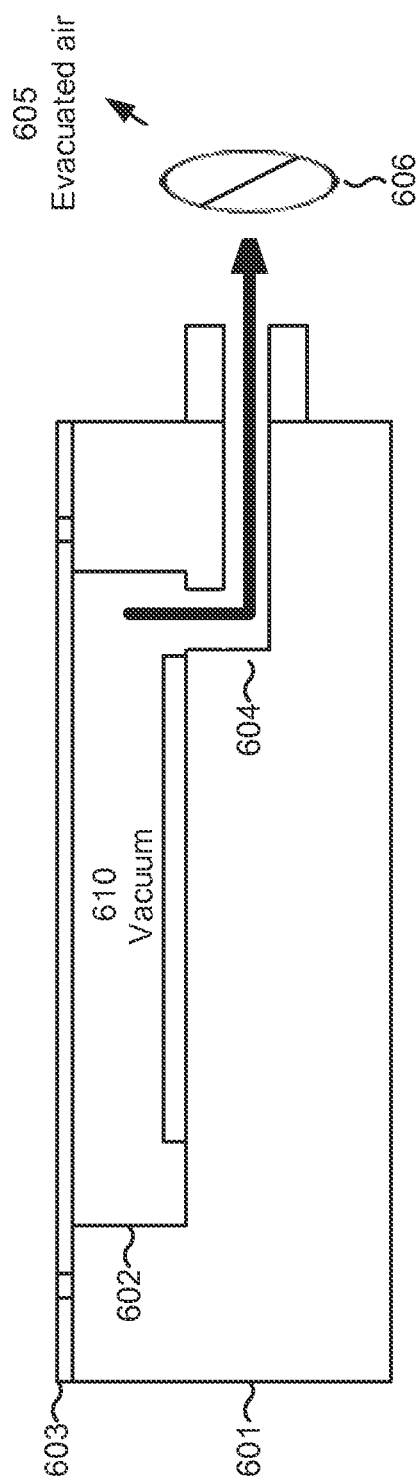
FIGS. 6A-6D are diagrams of an example implementation relating to the example process shown in FIG. 5.

As shown in FIG. 6A, heat pipe 601, which corresponds to heat pipe 435 shown in FIG. 4B, includes a cavity 602. Heat pipe 601 includes lid 603 welded to heat pipe 601 to form a cover over cavity 602. Cavity 602 includes opening 604. As shown by reference number 605, air is evacuated from cavity 602 via opening 604 and valve 606 using a pump (not shown). As shown by reference number 610, based on evacuating air from cavity 602, a vacuum environment is formed in cavity 602.

Figure 6B:
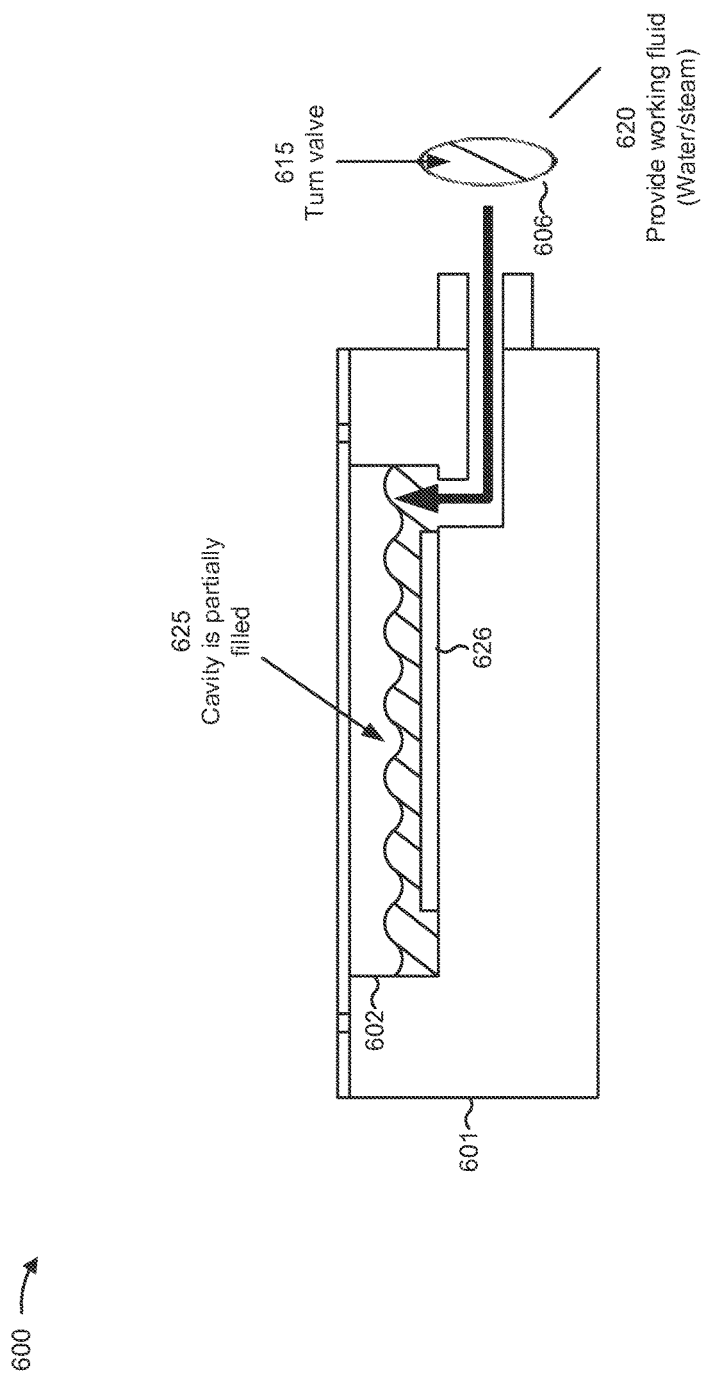

As shown in FIG. 6B, and by reference number 615, valve 606 is adjusted. As shown by reference number 620, a particular working fluid (e.g., water/steam) is injected via valve 606 based on adjusting valve 606 and using another pump. As shown by reference number 625, cavity 602 is partially filled with the particular working fluid to a height above corrugation 626.

Figure 6C:
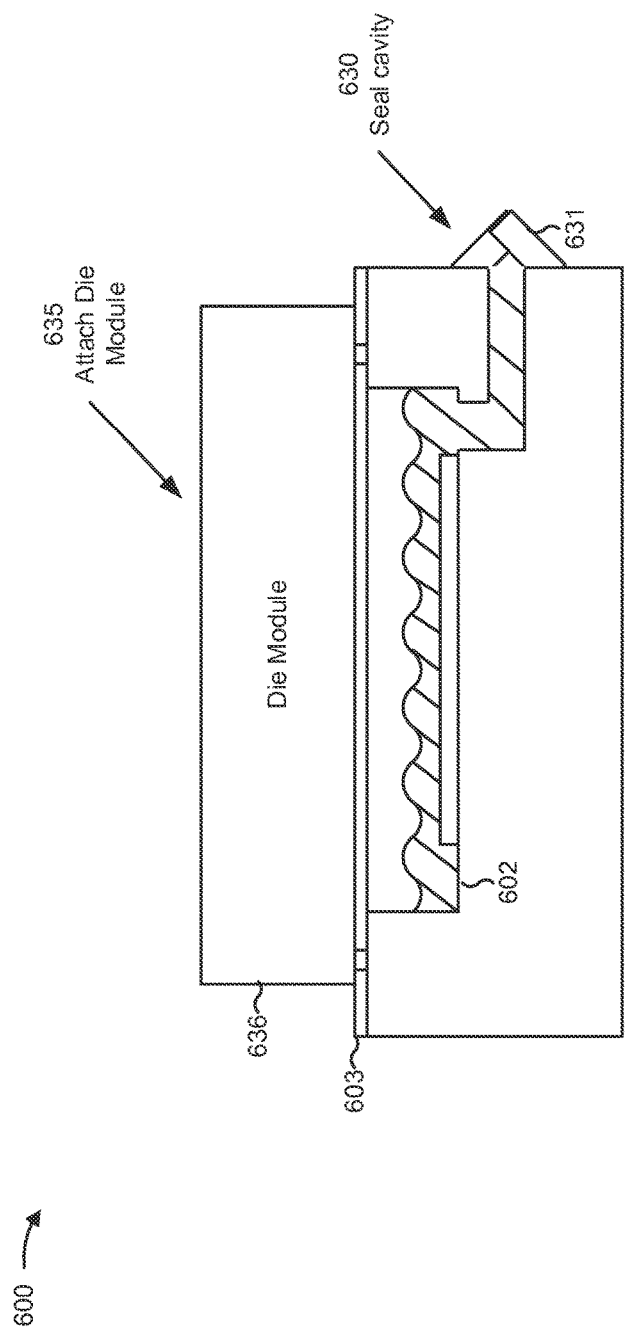

As shown in FIG. 6C, and by reference number 630, cavity 602 is sealed based on bending flanges 631. As shown by reference number 635, die module 636 is attached to lid 603. Assume that die module 636 is an integrated circuit and is operated, creating a hot-spot (e.g., an area of high heat relative to the remainder of die module 636).

Figure 6D:
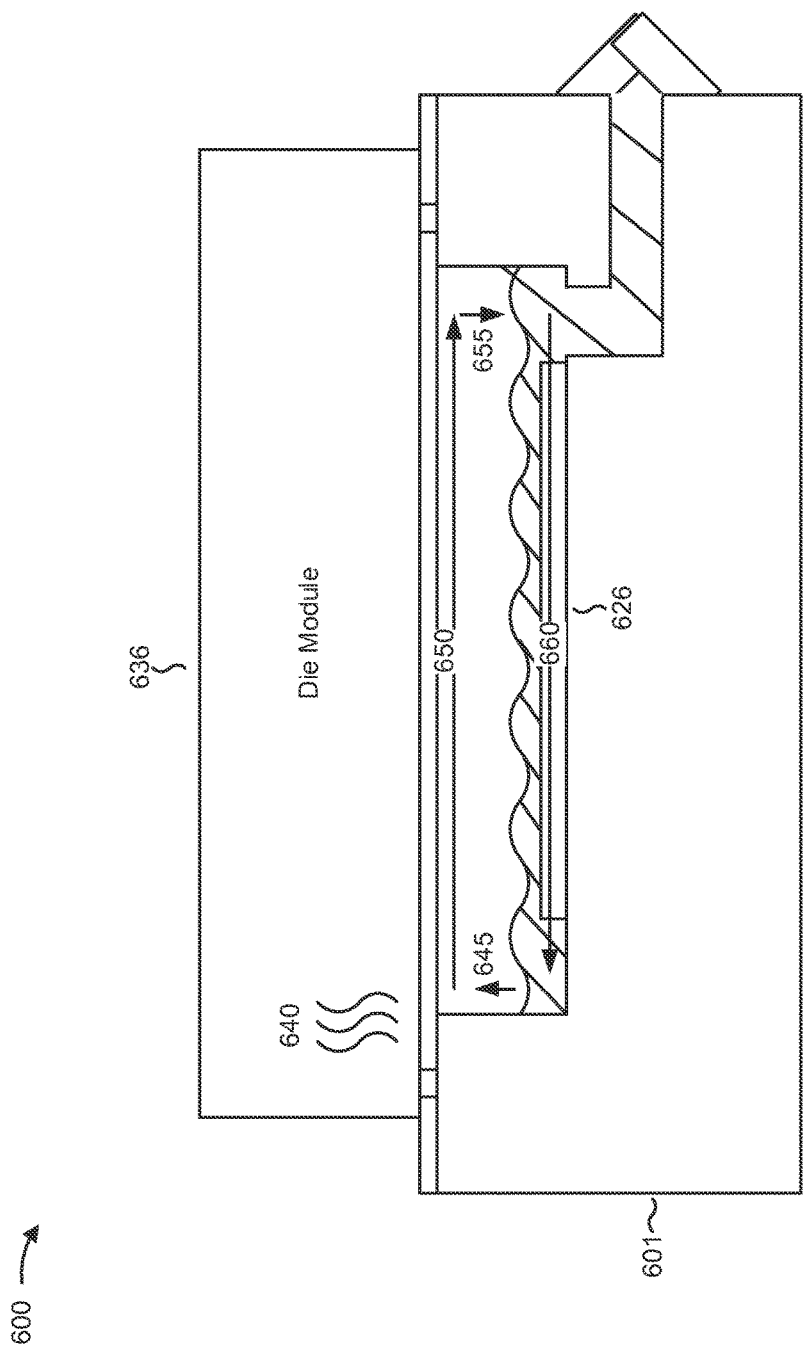

As shown in FIG. 6D, and by reference number 640, during operation of die module 636, the hot-spot is generated in die module 636 at a first, high heat end of die module 636. As shown by reference number 645, the working fluid in heat pipe 601 changes phase from liquid water to gaseous steam at an interface between the liquid water and heat pipe 601 as a result of the hot-spot, thereby removing heat from the first, high heat end of die module 636. As shown by reference number 650, the gaseous steam moves from an evaporator end of heat pipe 601 (e.g., an end adjacent to the first end of die module 636) toward a condenser end of heat pipe 601 (e.g., an end adjacent to a second, low heat end of die module 636). As shown by reference number 655, based on the condenser end of heat pipe 601 being associated with a lower temperature than the evaporator end (e.g., a temperature below the boiling point of water), the gaseous steam changes phase to liquid water, thereby releasing heat at the second, low heat end of die module 636. As shown by reference number 660, the liquid water moves from the condenser end to the evaporator end, aided by capillary movement caused by corrugation 626. In this way, the heat pipe may transfer heat away from a hot-spot of die module 640 and toward a relative cool-spot of die module 640 (cool as compared with the hot-spot).

As indicated above, FIGS. 6A-6D are provided merely as an example. Other examples are possible and may differ from what was described with regard to FIGS. 6A-6D.

In this way, a low-cost nano-heat pipe may be constructed to efficiently move heat from a high heat end of a die module to a low heat end of the die module.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, or a combination of hardware and software.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, etc.

No element, act, or instruction used herein should be construed as critical or essential unless explicitly described as such. Also, as used herein, the articles "a" and "an" are intended to include one or more items, and may be used interchangeably with "one or more." Furthermore, as used herein, the terms "group" and "set" are intended to include one or more items (e.g., related items, unrelated items, a combination of related items and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A heat pipe device, comprising:
a body section having a set of body section surfaces,
the set of body section surfaces including a top surface, a bottom surface, and a set of body section side surfaces,
the body section including a cavity extending from the top surface toward the bottom surface,
the cavity including a bottom surface and a set of cavity side surfaces,
the cavity being covered by a lid attaching to the top surface of the body section,
an opening extending through a portion of the body section, the opening having a first end provided in the bottom surface and a second end provided in a side surface of the body section, the opening having a bend between the first and second ends, such that the portion of the body section surrounds the opening,
the cavity being hermetically sealable by the lid, the body section, and a cover that covers the opening into the body section,
the bottom surface of the cavity including a set of corrugations.

2. The heat pipe device of claim 1, the lid being configured to attach to a heat generating module,
the heat generating module being affixed to the lid.

3. The heat pipe device of claim 1, the cavity being configured to receive a working fluid that fills the cavity to a level approximately even with a top surface of the set of corrugations.

4. The heat pipe device of claim 3, where
the cavity includes a working fluid in a liquid state and the working fluid in a gaseous state.

5. The heat pipe device of claim 1, where the set of corrugations are stamped or etched into the bottom surface of the cavity.

6. The heat pipe device of claim 1, where the set of corrugations are attached to the bottom surface of the cavity.

7. The heat pipe device of claim 1, where the cavity is stamped into the body section.

8. The heat pipe device of claim 1, where the cavity is etched into the body section.

9. A heat pipe, comprising:
a body section,
the body section being at least partially covered by a lid that is less than approximately 35 square millimeters in size,
the lid covering a cavity in the body section,
the cavity having a corrugated region extending along a portion of a bottom surface of the body section, the bottom surface of the body section having an opening extending through a portion of the body section from a first end in the bottom surface to a second end in a side surface of the body section, the opening including a bend between the first and second ends, such that the portion of the body section surrounds the opening,
the corrugated region having multiple corrugations, each corrugation, of the multiple corrugations, being less than approximately 0.75 millimeters in height and being separated from one or more other corrugations, of the multiple corrugations, by less than approximately 0.1 millimeters.

10. The heat pipe of claim 9, wherein
the opening facilitating evacuation of air from the cavity and injection of a working fluid into the cavity,
the opening being hermetically sealable.

11. The heat pipe of claim 9, where a particular separation between a first corrugation, of the multiple corrugations, and a second corrugation, of the multiple corrugations, is selected based on a capillary movement of a working fluid injected into the cavity.

12. The heat pipe of claim 9, where the body section is a three-dimensionally printed body section; and
where the corrugated bottom surface is a three-dimensionally printed corrugated bottom surface.

13. The heat pipe of claim 9, where the body section is further comprised of multiple body sections,
the multiple body sections being separately fabricated, the multiple body sections being attached together.

* * * * *